Figure 1:
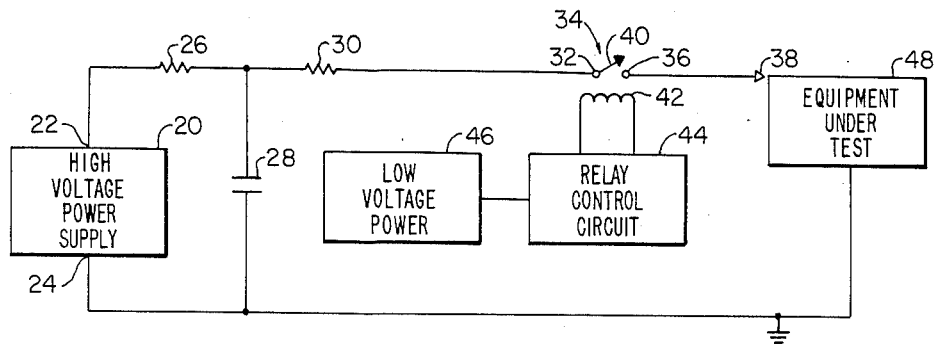

United States Patent [19]

Weil

[11] Patent Number: 4,721,899

[45] Date of Patent: Jan. 26, 1988

[54] COMBINED AIR-DIRECT TESTING SIMULATOR

[75] Inventor: Geoffrey M. Weil, Cambridge, Mass.

[73] Assignee: KeyTek Instrument Corp., Wilmington, Mass.

[21] Appl. No.: 17,142

[22] Filed: Feb. 20, 1987

[51] Int. Cl.[4] .............................................. H02J 7/00
[52] U.S. Cl. ....................................... 320/1; 342/415; 342/424
[58] Field of Search ..................... 320/1; 324/415, 421, 324/423, 424

[56] References Cited

U.S. PATENT DOCUMENTS 4,611,174  9/1986  Arnoux et al. ...................... 324/424

Primary Examiner—Patrick R. Salce
Assistant Examiner—Anita M. Ault
Attorney, Agent, or Firm—Schiller, Pandiscio & Kusmer

[57] ABSTRACT

Apparatus for applying a test static-electric discharge from a test tip to equipment under test in two modes, which apparatus includes a capacitor, a power supply, and a normally closed relay for connecting the high side of the capacitor to the tip. Means are provided for actuating the relay to open and close, and means are provided for actuating the power supply to charge the capacitor. In an air-discharge mode, the power supply is actuated for charging the capacitor while the relay is closed and thus not energized. For direct-injection mode operation, the apparatus includes a timing circuit interconnected so that the relay is opened a finite delay time before power supply is actuated to charge the capacitor, the relay remaining open until the capacitor is charged, and thereafter the relay automatically closes to permit discharge of the capacitor.

8 Claims, 2 Drawing Figures

COMBINED AIR-DIRECT TESTING SIMULATOR

This invention relates to electronic test equipment, and more particularly to electronic equipment for injecting test static-electric discharges to equipment under test (EUT). So-called direct electrostatic discharge (ESD) (also known as contact or direct-current injection), characteristically occurs when the tip of an ESD simulator is held in direct contact with a metal point on the EUT. In it, a discharge switch, usually a relay or other voltage-switching device within the ESD simulator, capable of carrying current appropriate to typical ESD's, is employed to connect the output of an appropriately charged internal capacitor, through a suitable internal series resistor and/or other impedance, to the ESD simulator's tip and thence to such metal point on the EUT.

In direct ESD the test current is injected directly, instead of by an air-discharge arc occurring between the simulator tip and the metal point on the EUT. As a result, if a repeatable internal switching means is employed in the ESD simulator, the character and waveform of the current injected into the EUT can be made highly repeatable from discharge to discharge. In air discharges without an internal switching mechanism in the simulator, large variations are typical from discharge to discharge.

The use of direct ESD, however, can be extremely awkward and time-consuming in real-world test situations, inasmuch as the simulator tip must be carefully brought into contact with metal parts, one at a time, all over the EUT, in order to investigate the ESD sensitivity of the EUT at each such point. The extra care required to make such exact contact prior to each discharge, is quite different from the much more casual and hence less time-consuming approach that can be taken with air discharge simulation. Since ESD test voltages are typically quite high (ranging from two or three up to eight or ten kilovolts or more), all that is required in air discharge testing is to bring the tip within one or two sixteenths of an inch of a metal point on the EUT, and a discharge will take place; i.e., super-careful positioning is not required.

It has been found by investigators working with both air discharge and direct ESD test methods, that it is often quite useful to do a preliminary air discharge "survey" of all possible points on the EUT that might exhibit ESD sensitivity, before going on to employ the more precise and repeatable, albeit more time-consuming, direct current injection to determine, with a high degree of accuracy as required, the exact sensitivity of the most sensitive points. The exact ESD sensitivity of low-sensitivity points is usually of no consequence, so they need not be tested with the more arduous direct ESD technique. This combined approach, using air discharge for preliminary determination of points of apparently high ESD sensitivity, coupled with direct current injection to determine with high accuracy what that sensitivity is, appears to be the most expeditious and effective way to perform ESD testing. This combined mode is hereinafter referred to, for convenience as CAD testing i.e., combined air-direct testing.

Most ESD simulators have both single-shot and repetitive modes; i.e., it is possible, by pulling a trigger or depressing an "on" switch, to generate a single ESD, or alternatively to generate a continuous train of ESD's, usually at a rate on the order of ten or twenty times a second. The multiple-ESD mode is usually preferable, as it obviously gives far more data on EUT ESD sensitivity in a short period of time. Unfortunately when a discharge switch, typically a relay, is used in the ESD simulator, it is then exercised at this high rate during the preliminary air-discharge phase of the operation, which may go on for some period of time, thereby unnecessarily dissipating large portions of the service life of the internal switch. This life is usually limited in terms of the total number of operations the discharge switch or relay can perform before it must be replaced. The switch is usually expensive, and it is often difficult to replace, as it tends to be surrounded by and even encapsulated along with other high-voltage components. The air-discharge preliminary portion of CAD testing with simulators incorporating internal relays or other switches, may be effected simply by maintaining the internal switch in the "on" position while doing the initial, rough, air-discharge investigation. The simulator is then used in its direct injection mode for final direct-contact data taking, i.e. closing the internal switch only after the internal capacitor's voltage is fully elevated and the simulator's tip contacts a metal point on the EUT. This approach has several problems, the net result of which is to make for a much less useable, less rugged and less dependable ESD simulation instrument.

At the same time that the need for CAD testing has been recognized, the steadily increasing requirement for ESD tests on virtually all electronic equipment, both after installation as well as in the laboratory, has made battery operation for ESD simulators an appealing approach for freeing the test operator from at least one of the wires usually associated with such simulators, i.e. the ac power cord. High rate of discharges either severely shortens the life of conventional batteries, or makes it necessary to do far more frequent recharging when rechargeable batteries are used.

Accordingly, a primary object of the present invention is to provide a structure for performing direct ESD simulation, which structure is designed to extend the life of the simulator's discharge switch or relay, and in particular to minimize switch usage when the simulator operates in the air discharge mode used for preliminary testing within an overall CAD testing strategy. Another object of the present invention is to provide the aforesaid structure that does not require continuous relay or switch power in order to perform air discharge testing, either for its own sake or as part of an overall CAD testing strategy.

The foregoing and other objects of the present invention are preferably effected by providing an improvement in apparatus for applying a test static-electric discharge from a test tip to EUT, which apparatus includes chargeable capacitive storage means for storing electrical power, and electrically actuatable switching means for connecting and disconnecting the test tip to and from the capacitive storage means. In the present invention, the electrically actuatable switching means are disposed in a normally closed mode wherein the test tip is connected to the capacitive storage means. The present improvement then comprises means for electrically operating the switching means to open and disconnect the capacitive storage means from the test tip for a period of time at the end of which, the switching means is electrically deactuated to return to its normally closed mode, and means for electrically delaying charge of the capacitive storage means until the switching means has opened in response to an actuating signal.

Figure 2:
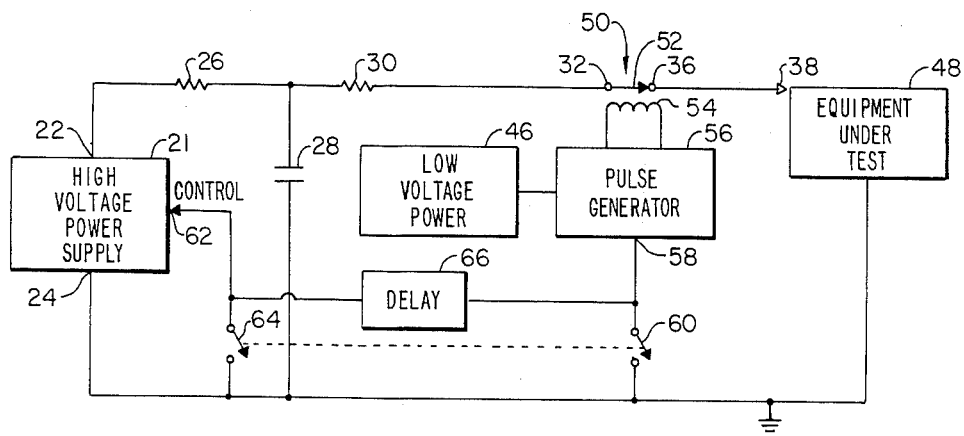

For a fuller understanding of the nature and objects of the present invention, reference should be had to the following detailed description taken in connection with the accompanying drawing in which like numerals in the several drawings are employed to denote like parts, and wherein:

FIG. 1 is a block diagram of an exemplary prior-art contact, direct or direct current-injection simulator; and FIG. 2 is a block diagram of a simulator embodying the principles of the present invention.

As shown in FIG. 1, a typical, prior-art ESD, CAD simulator includes high voltage power supply 20 having high voltage output terminal 22 and grounded output terminal 24 across which a high voltage (e.g. up to tens of kilovolts) can be provided. One side of charging resistor 26, typically of high resistance (e.g. tens or hundreds of megohms) is connected to terminal 22, charging capacitor 28 being connected between the other side of resistor 26 and ground. One side of discharge resistor 30 (e.g. a few tens to a few hundreds of ohms) is connected to terminal 32 of relay switch 34, the other side of resistor 30 being connected to the junction of resistor 26 and capacitor 28. Output terminal 36 of relay 34 in turn is connected to metallic tip 38 of the simulator. Relay 34 typically includes relay armature 40 actuated by relay coil 42 so as to connect or disconnect terminal 32 to or from terminal 36. Relay 34 in this prior art simulator typically is a normally open relay, i.e. armature 40 is so positioned that terminal 32 normally is not connected to terminal 36. Relay coil 42 is controlled by relay control circuit 44, the latter being connected to low voltage power source 46 which serves to provide excitation current to relay coil 42 in accordance with the desired operation of circuit 44.

In operation, capacitor 28 is first charged to a high voltage by power supply 20 through charging resistor 26. Capacitor 28 is subsequently discharged through resistor 30 into EUT 48 by direct ohmic contact between metallic tip 38 and a metal point on the EUT. This discharge occurs when the normally open contacts on discharge relay 34 are closed in response typically to a current applied to coil 42. Following the discharge, relay 34 reopens, usually under a magnetic or spring bias following interruption of relay power, in order to permit capacitor 28 to be recharged. Otherwise, the low resistance between capacitor 28 and simulator tip 38, in effect grounded by contact of the tip with the metal on the EUT, would prevent application of any significant charging voltage to capacitor 28, particularly in view of the extremely low ratio of the resistances of resistor 30 to resistor 26.

The circuit of FIG. 1, therefore, requires relay control circuit 44 which may, for example, operate on a timed basis, i.e. some milliseconds after the relay is opened long enough to allow capacitor 28 to be fully re-charged, relay 34 will automatically close. Alternatively, a sensing circuit can be provided to determine when capacitor 28 is fully charged, and responsively provide a signal that will close relay 34. Yet another alternative is to have a second switch, controlled by the operator, close relay 34; i.e., a first switch turns on the high voltage supply while the second one connects the relay. This latter alternative is clearly not practical for the high-speed testing (i.e. ten or twenty discharges a second) that is so very desirable in many circumstances.

None of the above three methods for obtaining relay closure yields a configuration that will work satisfactorily in both air discharge and current injection modes, for one or more reasons:

The first alternative, in which the relay basically cycles at a predetermined rate, (e.g. ten or twenty cycles per second), wears out the relay even when it isn't needed—i.e. in a simple air discharge. In addition, if the simulator is battery powered, there are similar negative connotations in connection with reduced battery life and reduction in time between battery recharges.

The second alternative (having a sensing circuit determine when the capacitor is charged and then closing the relay) has the advantage that if no discharges are taking place—i.e. the tip is approaching the EUT but is still too far from it—the relay won't be exercised. But, as soon as discharges start at or within the critical distance for the capacitor charge-voltage involved, the relay will be exercised at the same rate as in the first scheme. This second alternative gives the relay some relief in regard to operating life; but the method still exercises the relay needlessly once discharging begins. Similarly, there are negative implications regarding battery life or time between recharges, for a battery-operated simulator.

The third alternative does not appear practical. One simply can't close the relay, by manual switch operation, at a fast enough rate for current injection testing at reasonable repetition rates. Also, if the relay is simply held "on" during air discharge testing, battery life will be very adversely affected when the simulator is battery powered.

Yet another alternative in the prior art, is to connect simulator tip 38 with contact 32 of the relay (i.e. the contact permanently connected through resistor 30 to the high-voltage end of capacitor 28) when air discharge is desired, and to have the operator physically move tip 38 when changing from air discharge to current injection modes, and vice versa. This repeated removal and re-insertion of the tip, or any analogous physical re-configuration of the simulator to achieve the same effect, can provide significant interference with the smooth performance of the test plan. A typical plan may require going back and forth repeatedly between air discharge and current injection at a given point on the EUT, as deemed necessary by the operator in the light of EUT malfunctions as they occur during the test. The physically-moved-tip method has the additional disadvantage that the operator is constantly touching the tip, presumably after releasing the high-voltage "on" switch so that the tip is at a high voltage. In such case, it is likely that due either to equipment malfunction or to operator inexperience or confusion, the operator, with disastrous consequences, may inadvertently touch the tip while its voltage is still at a multi-kilovolt level.

The principles of the present invention are shown schematically in the embodiment of the ESD-CAD simulator shown in FIG. 2. The latter includes a basic circuit similar in many respects to the prior art, and thus includes high voltage power supply 21 having high voltage output terminal 22 and grounded output terminal 24 across which typically a voltage in the range of up to tens of kilovolts can be provided. One side of high resistance charging resistor 26 (e.g. tens or hundreds of megohms) is connected to terminal 22. Charging capacitor 28 is connected between the other side of resistor 26 and ground. A discharge resistor 30, of a few tens to hundreds of ohms, has one side connected to terminal 32 of relay switch 50, the other side of resistor 30 being connected to the junction of resistor 26 and capacitor 28. Output terminal 36 of relay 50 is connected to metallic tip 38 of the simulator.

Relay 50 typically includes relay armature 52 activated by relay coil 54 so as to connect or disconnect terminal 32 to or from terminal 36. In the simulator of the present invention, relay 50 is normally closed, i.e. armature 52 is typically magnetically or spring-biased into a position wherein terminal 32 is connected to terminal 36. Excitation of relay coil 54 is controlled by timing signal generator 56, the latter being powered by connection to low voltage power source 46 which may be an AC powered DC supply, a battery or the like. Generator 56, for example a square-wave generator having an output of typically 25 pulses/sec., includes control terminal 58, connectable by switch 60 to ground. Application of a suitable signal, arising by operation of switch 60, at terminal 58 actuates generator 56 to provide a series of sequential on and off pulses (each of 40 ms duration in this example) through coil 54. The pulsing of the coil moves armature 52, against its spring or magnetic bias, when the coil is energized or under the bias when the coil is de-energized, to respectively disconnect and connect terminals 32 and 36 to one another for 40 ms intervals.

Power supply 21 is also controllable, i.e. it includes control input terminal 62 at which the application of a suitable signal will cause supply 21 to provide power across terminals 22 and 24, or will terminate the supply of such power. Terminal 62 is connectable, through operation of switch 64, to ground, the pertinent signal to terminal 62 being provided by operation of switch 64.

In the preferred embodiment both switches 60 and 64 are momentary "on" switches, i.e. they are switches that are normally held open, typically by a spring bias and which will close upon application of manual pressure to the switch, only for a short interval of time, typically long enough to allow for several full cycles of operation of relay 50. Switches 60 and 64 are physically connected or ganged, as indicated by a dashed line in FIG. 2, so that closure of either switch automatically prevents simultaneous closure of the other switch. It will be appreciated that in the absence of any mechanical interconnection between switches 60 and 64, closure of switch 64 will effectively electrically overide the operation of switch 60. Such switching arrangements are well known in the art and hence need no further description here.

In an alternative embodiment, the switching arrangement can be effected by a simple three way switch having an armature connected to ground and movable to connect ground alternatively with a center-position disconnect or either of two outer terminals repectively connected to terminals 58 and 62.

Lastly, terminal 62 is connected to terminal 58 through unidirectional electrical time delay circuit 66 that introduces a delay, typically 5 ms, in the application of any signal to terminal 62 provided by the operation of switch 60.

In operation, capacitor 28 is charged to a high voltage by power supply 21 through charging resistor 26, but only when the requisite voltage appears across terminals 22 and 24. The requisite voltage will appear substantially instantaneously upon application of a control signal to terminal 62 occasioned by the closure of switch 64. Alternatively, closure of switch 60 (switch 64 being open) will also apply a delayed control signal to control terminal 62, and the voltage will not appear across terminals 22 and 24 until after a predetermined delay introduced by delay circuit 66 following closure of switch 60.

It will be seen that closure of switch 64 will provide a control signal only to terminal 62, and because delay circuit 66 is unidirectional, the latter blocks application of that signal to terminal 58. Consequently, pulse generator 56 is not activated and relay coil 54 remains de-energized so that relay 50 remains closed. In such case, tip 38 is connected through resistor 30 to the output of high voltage capacitor 28 and the simulator is automatically available in an air-discharge mode without adverse effect on the life of relay 50 or battery life.

Closure of switch 60, however, (switch 64 being open) will apply a control signal simultaneously to the input to delay circuit 66 and to control terminal 58 of pulse generator 56, exciting relay coil 54 and thereby causing relay 50 to open and disconnect tip 38 from capacitor 28. The signal applied to delay circuit 66 is delayed for a short period of time sufficient to permit relay 50 to open. Relay 50 will now remain open for the pulse period provided by generator 56. Because the delay period provided by delay circuit 66 is larger than the turn-on time required by relay 50, and the relay must stay open during the charging period of capacitor 28, the delayed signal appearing at the output of delay circuit 66 and hence applied to control terminal 62, causes power supply 21 to provide charging power to capacitor 28 only after tip 38 has been safely disconnected from capacitor 28 by the opening of relay 52. At the end of this first 40 ms pulse period provided by generator 56, the output of the latter deenergizes coil 54 for another pulse period. Consequently, relay 50 automatically closes and applies the charge on capacitor 28 to tip 38. As the output of generator 56 cycles through successive pulse periods, as long as switch 60 remains closed, capacitor 28 will charge and discharge in a like cycle. Opening switch 60 removes the control signal from both control terminals 58 and 62 stopping operation of the pulse generator and the supply of energy from power supply 21.

The 5 ms delay period provided by delay circuit 66 and the 40 ms pulse duration provided by pulse generator 56 are merely exemplary values. The pulse duration, of course, is a function of relay turn-on and drop-out time, the high voltage supply time constant, and other factors. It is, of course, necessary that the delay time provided by delay circuit 66 be long enough to permit relay 50 to first open before power is applied to charge capacitor 28 and that the total pulse duration during which relay 50 remains open is sufficient to permit capacitor 28 to charge fully. Similarly, it is important that the duration of the off-pulse provided by generator 56 that de-energizes coil 54 and thereby permits relay 50 to connect tip 38 to capacitor 28, be long enough to permit the capacitor to discharge fully from tip 38 into EUT 48.

The instant invention operates in such a way that an operator can readily call for air-discharge operation from the simulator when it is appropriate, and then quickly and conveniently put the simulator into current-injection mode. Changing back and forth between the two modes is readily and simply accomplished. The structure of the invention that provides these features does not require relay operation at all during air-discharge mode; thereby avoiding the needless consumption of any of its service life in a mode in which the relay operation is not required. Also, no current is required from the battery in a battery-operated simulator in the air discharge mode, since the relay is continually de-energized in that mode.

Since certain changes may be made in the above apparatus without departing from the scope of the invention herein involved, it is intended that all material contained in the above description or shown in the accompanying drawing shall be interpreted in an illustrative and not in a limiting sense.

What is claimed is:

1. In apparatus for applying a test static-electric discharge from a test tip to equipment under test, said apparatus including electrically chargeable capacitive storage means for storing electrical energy, and electrically actuatable switching means for connecting and disconnecting said tip to and from said capacitive storage means, the improvement wherein:

said switching means are normally in a mode wherein said tip is connected to said capacitive storage means, and said improvement comprises:

means for first electrically actuating said switching means to disconnect said capacitive storage means from said tip for a first period of time, and to reconnect said capacitive storage means to said tip at the end of said first period of time, and means for delaying charging said capacitive storage means for a second period of time following actuation of said switching means to disconnect said storage means from said tip, said second period being shorter than said first period.

2. The improvement as defined in claim 1 wherein said means for first electrically actuating said switching means is operable responsively to a first control signal.

3. The improvement as defined in claim 2 including a controllable high voltage power supply for providing electrical charges to said capacitive storage means responsively only to a second control signal.

4. The improvement as defined in claim 3 including means for providing said first control signal to said means for actuating said switching means, and means for providing, after a predetermined delay following actuation of said switching means, said second control signal to which said controllable high voltage power supply is responsive.

5. The improvement as defined in claim 4 wherein said means for providing said first control signal includes a first manually operable, momentary-close switch.

6. The improvement as defined in claim 4 including alternative means for providing said second control signal, said means for providing said first control signal and said alternative means for providing said second control signals being operable mutually exclusively from one another.

7. The improvement as defined in claim 6 wherein said alternative means for providing said second control signal comprises a second manually operable, momentary-close switch.

8. Apparatus for applying a test static-electric discharge from a test tip to equipment under test, said apparatus comrising:

chargeable capacitive storage means for storing electrical power, power supply means for providing high voltage electrical power, resistive means connected for charging said storage means from said power supply means;

means for controlling the application of charges from said power supply to said storage means, electrically actuatable switching means for electrically connecting and disconnecting said tip to and from said capacitive storage means, said switching means being in a normally closed mode so as to connect said tip to said capacitive storage means, means for electrically activating said switching means to open and disconnect the said capacitive storage means from said tip for a first period of time at the end of which, said switching means is deactivated to return to said normally closed mode, and means for electrically delaying charging of said capacitive storage means until said switching means has been activated to open.

* * * * *